United States Patent
Velichko et al.

(10) Patent No.: US 9,854,184 B2
(45) Date of Patent: Dec. 26, 2017

(54) IMAGING PIXELS WITH A FULLY DEPLETED CHARGE TRANSFER PATH

(71) Applicant: SEMICONDUCTOR COMPONENTS INDUSTRIES, LLC, Phoenix, AZ (US)

(72) Inventors: Sergey Velichko, Boise, ID (US); Vladimir Korobov, San Mateo, CA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 7 days.

(21) Appl. No.: 15/176,317

(22) Filed: Jun. 8, 2016

(65) Prior Publication Data

US 2017/0257578 A1 Sep. 7, 2017

Related U.S. Application Data

(60) Provisional application No. 62/301,969, filed on Mar. 1, 2016.

(51) Int. Cl.
| | |
|---|---|
| *H04N 5/335* | (2011.01) |
| *H04N 3/14* | (2006.01) |
| *H04N 5/353* | (2011.01) |
| *H01L 27/146* | (2006.01) |
| *H04N 5/357* | (2011.01) |
| *H04N 5/378* | (2011.01) |

(52) U.S. Cl.
CPC ....... *H04N 5/353* (2013.01); *H01L 27/14605* (2013.01); *H01L 27/14629* (2013.01); *H01L 27/14634* (2013.01); *H01L 27/14636* (2013.01); *H01L 27/14643* (2013.01); *H04N 5/3575* (2013.01); *H04N 5/378* (2013.01)

(58) Field of Classification Search
None
See application file for complete search history.

(56) References Cited

PUBLICATIONS

Hong, U.S. Appl. No. 14/877,722, filed Oct. 7, 2015.
Velichko et al., U.S. Appl. No. 14/836,599, filed Aug. 26, 2015.

*Primary Examiner* — Stephen Coleman
(74) *Attorney, Agent, or Firm* — Treyz Law Group, P.C.; Joseph F. Guihan

(57) ABSTRACT

An imaging pixel may have a fully depleted charge transfer path between a pinned photodiode and a floating diffusion region. A pinned transfer diode may be coupled between the pinned photodiode and the floating diffusion region. The imaging pixel may be formed in upper and lower substrates with an interconnect layer coupling the upper substrate to the lower substrate. The imaging pixel may include one or more storage diodes coupled between the transfer diode and the floating diffusion region. The imaging pixel may be used to capture high dynamic range images with flicker mitigation, images synchronized with light sources, or for high frame rate operation.

20 Claims, 17 Drawing Sheets

IMAGING PIXELS WITH A FULLY DEPLETED CHARGE TRANSFER PATH

CROSS-REFERENCE TO RELATED APPLICATION(S)

This application claims priority to U.S. Provisional Application No. 62/301,969, filed on Mar. 1, 2016, entitled "Imaging Pixels with a Fully Depleted Charge Transfer Path," invented by Sergey Velichko and Vladmir Korobov, and is incorporated herein by reference and priority thereto for common subject matter is hereby claimed.

BACKGROUND

This relates generally to imaging systems and, more particularly, to imaging systems that have imaging pixels.

Modern electronic devices such as cellular telephones, cameras, and computers often use digital image sensors. Image sensors (sometimes referred to as imagers) may be formed from a two-dimensional array of image sensing pixels. Each pixel includes a photosensitive layer that receives incident photons (light) and converts the photons into electrical charge. Image sensors are sometimes designed to provide images to electronic devices using a Joint Photographic Experts Group (JPEG) format.

In conventional imaging systems, image artifacts may be caused by moving objects, moving or shaking camera, flickering lighting, and objects with changing illumination in an image frame. Such artifacts may include, for example, missing parts of an object, edge color artifacts, and object distortion. Examples of objects with changing illumination include light-emitting diode (LED) traffic signs (which can flicker several hundred times per second) and LED brake lights or headlights of modern cars.

Conventional imaging systems also may have images with artifacts associated with low dynamic range. Scenes with bright and dark portions may produce artifacts in conventional image sensors, as portions of the image may be over exposed or under exposed.

It would therefore be desirable to provide improved imaging pixels for image sensors.

DETAILED DESCRIPTION

Figure 1:
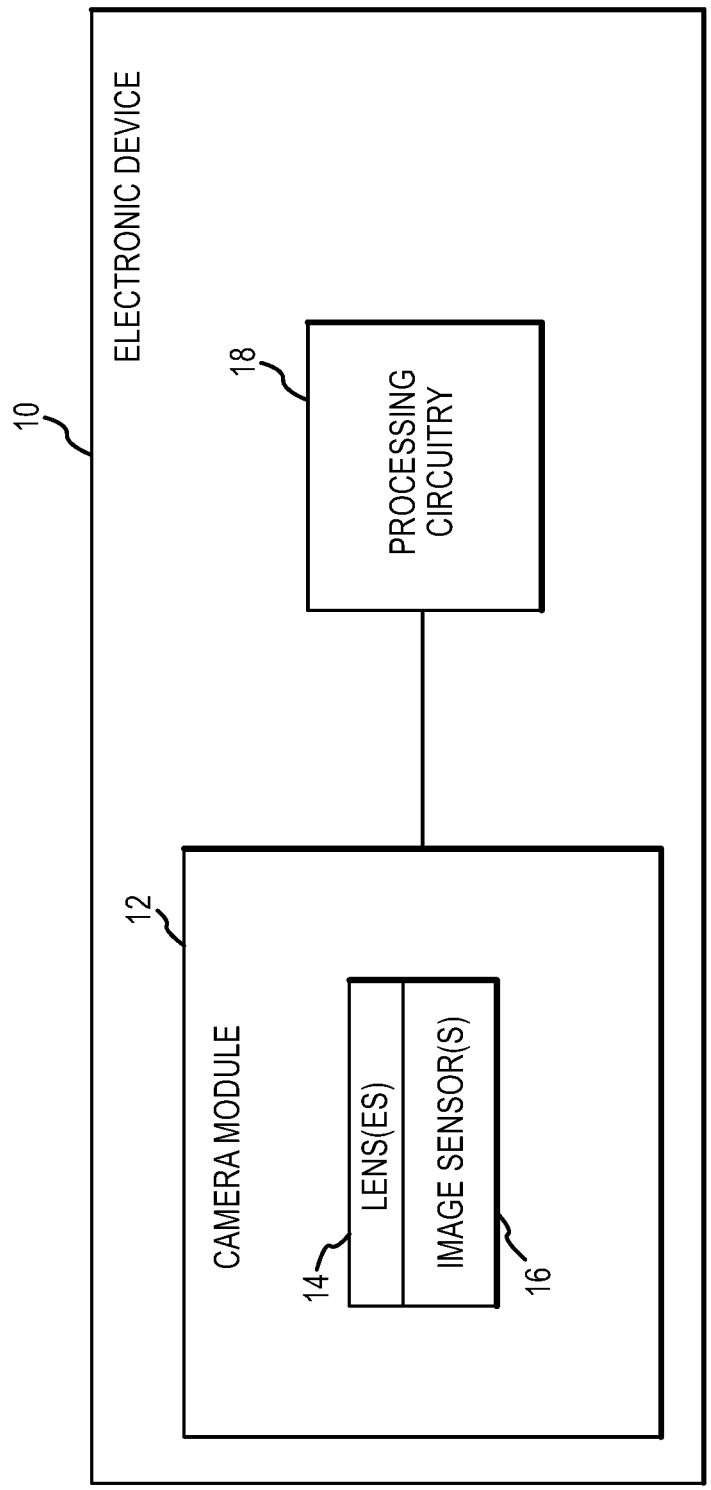
FIG. 1 is a schematic diagram of an illustrative electronic device that may include an image sensor in accordance with an embodiment of the present invention.

Embodiments of the present invention relate to image sensors with pixels that may have a fully depleted charge transfer path. An illustrative electronic device that may include pixels with a fully depleted charge transfer path is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 14. During operation, lenses 14 focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC)

converter circuitry, data output circuitry, memory (e.g., buffer circuitry), address circuitry, etc.

Still and video image data from image sensor 16 may be provided to processing circuitry 18. Processing circuitry 18 may be used to perform image processing functions such as automatic focusing functions, depth sensing, data formatting, adjusting white balance and exposure, implementing video image stabilization, face detection, etc.

Processing circuitry 18 may also be used to compress raw camera image files if desired (e.g., to Joint Photographic Experts Group or JPEG format). In a typical arrangement, which is sometimes referred to as a system on chip (SOC) arrangement, image sensor 16 and processing circuitry 18 are implemented on a common integrated circuit. The use of a single integrated circuit to implement image sensor 16 and processing circuitry 18 can help to reduce costs. This is, however, merely illustrative. If desired, image sensor 16 and processing circuitry 18 may be implemented using separate integrated circuits. Processing circuitry 18 may include microprocessors, microcontrollers, digital signal processors, application specific integrated circuits, or other processing circuits.

Figure 2:
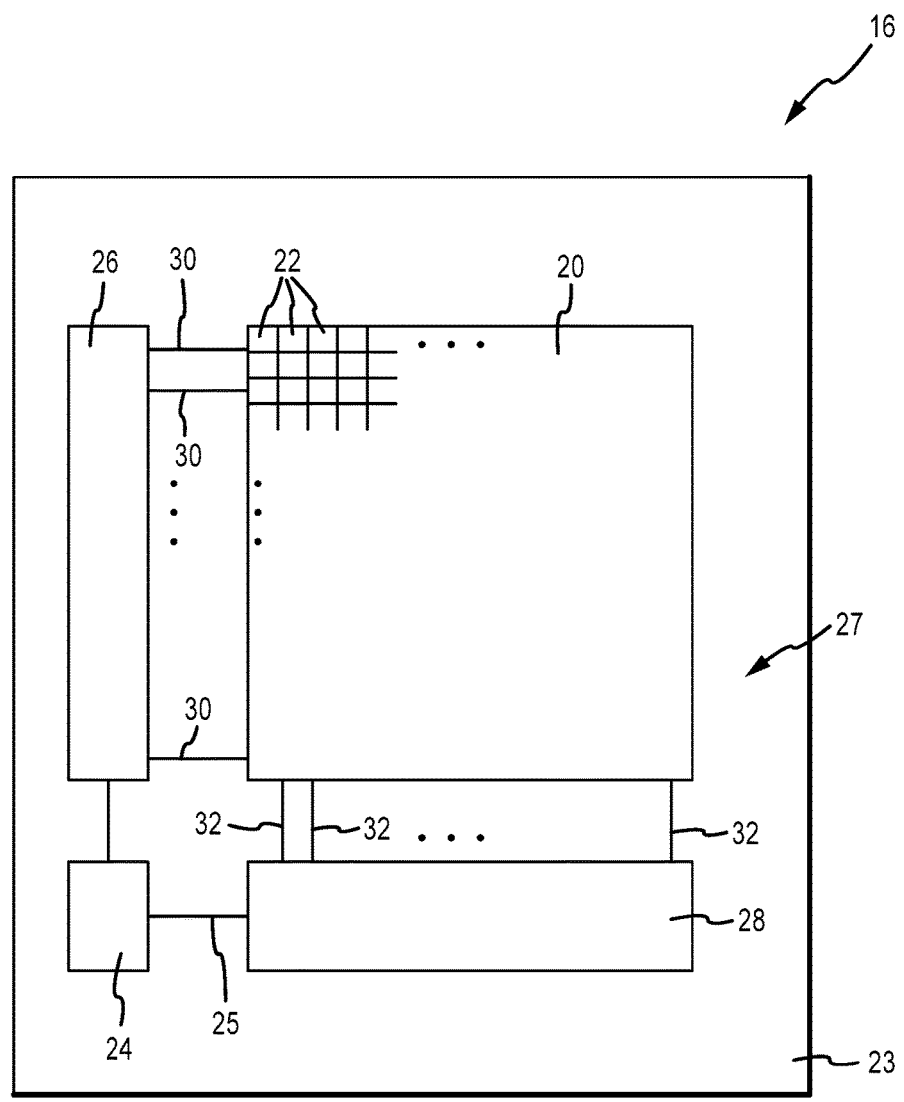
FIG. 2 is a diagram of an illustrative pixel array and associated readout circuitry for reading out image signals from the pixel array in accordance with an embodiment of the present invention.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry).

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

Figure 3:
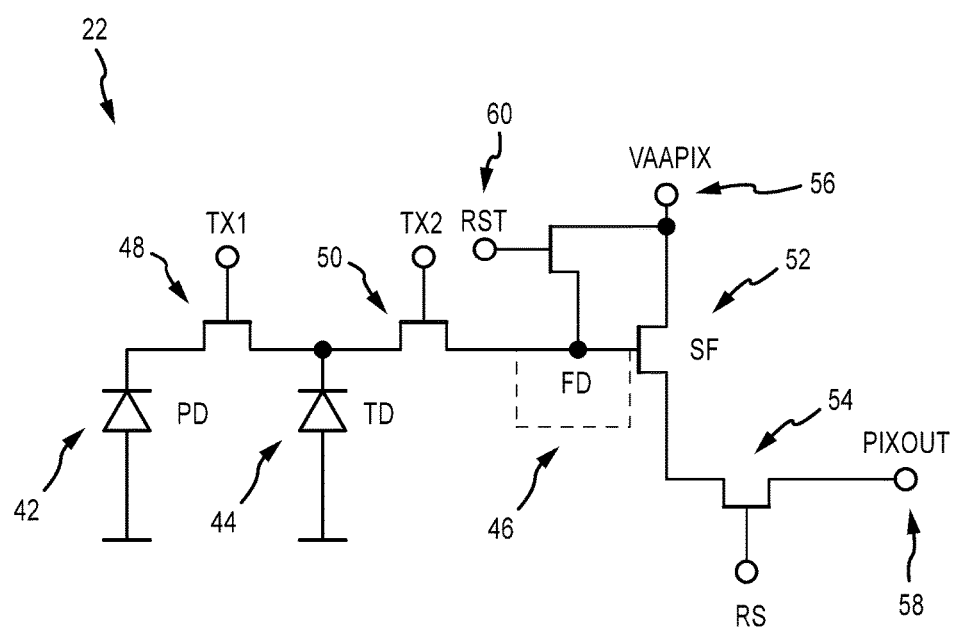
FIG. 3 is a diagram of an illustrative imaging pixel with a fully depleted charge transfer path in accordance with an embodiment of the present invention.

FIG. 3 is a diagram of an illustrative pixel with a fully depleted charge transfer path. As shown in FIG. 3, pixel 22 may include a photodiode 42, a transfer diode 44, and a floating diffusion region 46. Photodiode (PD) 42 may be formed from a doped semiconductor material such as silicon and may be a pinned photodiode. Transfer diode (TD) 44 may also be a pinned photodiode formed from a doped semiconductor material. Photodiode 42 and transfer diode 44 may, for example, be formed from n-type doped silicon with a p-type pinning layer. Due to the concentration of dopant in photodiode 42 and transfer diode 44, PD 42 and TD 44 may be pinned with an electric potential. Floating diffusion (FD) region 46 may be implemented using a region of doped semiconductor (e.g., a doped silicon region formed in a silicon substrate by ion implantation, impurity diffusion, or other doping techniques).

Pixel 22 may include a transfer transistor 48 between photodiode 42 and transfer diode 44 and an additional transfer transistor 50 between transfer diode 44 and floating diffusion 46. When transfer transistor 48 (TX1) is asserted, charge may flow from photodiode 42 to transfer diode 44. When transfer transistor 50 (TX2) is asserted, charge may flow from transfer diode 44 to floating diffusion region 46. In order to ensure that charge may be transferred to the floating diffusion region in this way, there may be a voltage potential profile in pixel 22, where the potential at PD 42 is the smallest, the potential at FD 46 is the largest, and the potential at TD 44 is in between ($V_{PD} < V_{TD} < V_{FD}$). This profile of potentials will ensure that charge flows through the transfer path appropriately.

During operation of pixel 22, charge may accumulate in photodiode 42 in response to incident light. When it is desired to read out the charge from photodiode 42, transfer transistors 48 and 50 may be asserted to transfer the charge to floating diffusion region 46. The signal associated with the stored charge on floating diffusion 46 may be conveyed to row select transistor 54 by source-follower transistor 52. Source-follower transistor 52 (SF) may be coupled to bias voltage 56 ($V_{AAPIX}$). Source-follower transistor may be an n-type metal-oxide-semiconductor field-effect transistor or a p-type metal-oxide-semiconductor field-effect transistor.

When it is desired to read out the value of the charge at the floating diffusion region, row select (RS) transistor 54 may be asserted. When the RS transistor is asserted, a corresponding signal $Pix_{OUT}$ (58) that is representative of the magnitude of the charge on floating diffusion region 46 is produced. In a typical configuration, there are numerous rows and columns of pixels such as pixel 22 in the image sensor pixel array of a given image sensor. A vertical conductive path may be associated with each column of pixels. Pixel 22 may also include a reset transistor 60 for resetting the charge at floating diffusion region 46. Reset transistor 60 may be coupled between floating diffusion region and bias voltage 56. When reset transistor is asserted, charge from floating diffusion region 46 may be cleared from the pixel. To reset transfer diode 44, transfer transistor 50 and reset transistor 60 may be asserted. To reset photodiode 42, transfer transistor 48, transfer transistor 50 and reset transistor 60 may be asserted.

The transfer path between photodiode 42 and floating diffusion region 46 may be fully depleted. This means that there is no free charge in the transfer path before the charge from the incident light is transferred. This ensures that the charge from the incident light is not affected by other charge that is not from the incident light, reducing noise. The arrangement of pixel 22 with a fully depleted charge transfer path enables both rolling shutter and global shutter usage. In a global shutter, every pixel in the image sensor may simultaneously capture an image, whereas in a rolling shutter each row of pixels may sequentially capture an image. Additionally, pixel 22 may have a very high pixel conversion gain that is independent of parasitic capacitance between photodiode 42 and floating diffusion 46.

Figure 4:
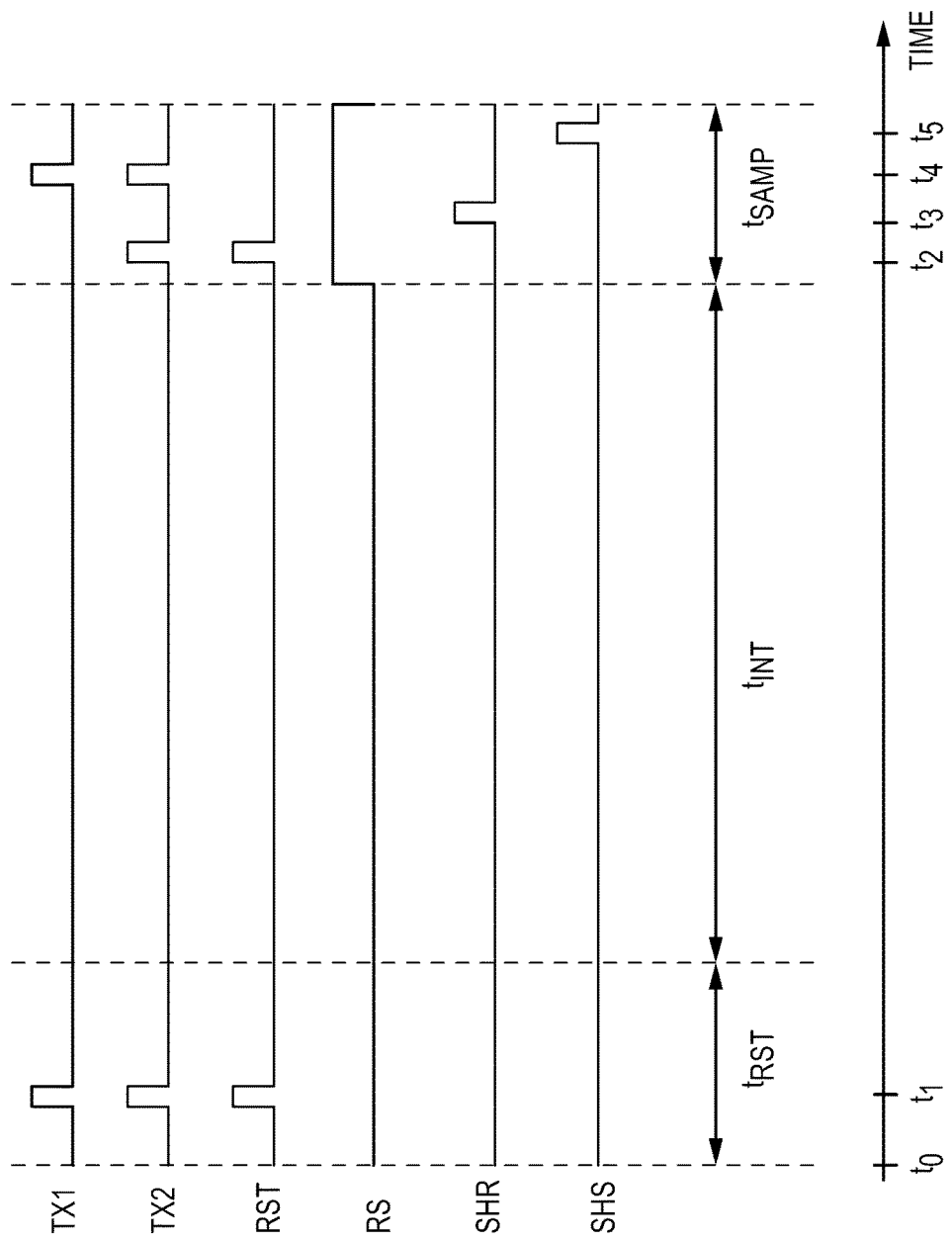
FIG. 4 is a timing diagram showing how an illustrative imaging pixel with a fully depleted charge transfer path may be operated in accordance with an embodiment of the present invention.

FIG. 4 is a diagram of an illustrative timing scheme for asserting various transistors in pixel 22. As shown, transfer transistor 48 (TX1), transfer transistor 50 (TX2), and reset transistor 60 (RST) may be asserted at $t_1$. This resets the charge at photodiode 42 during a reset period $t_{RST}$. After $t_{RST}$, charge may accumulate in photodiode 42 during an acquisition period $t_{INT}$. After $t_{INT}$, the charge from photodiode 42 may be read out during $t_{SAMP}$. Row select transistor 54 (RS) may be asserted throughout $t_{SAMP}$. The charge from photodiode 42 may be sampled using a correlated double sampling (CDS) technique.

Correlated double sampling is used to correct for noise in imaging pixels. Charge at the floating diffusion region may be sampled to determine the amount of incident light exposure for the imaging pixel. Ideally, all of the charge at the floating diffusion region would be associated with the incident light. However, in reality this is not the case and some of the charge will be present due to noise. In order to isolate the charge that comes from the incident light, correlated double sampling compares the reset charge level at the FD to the sample charge level at the FD. The reset charge level is the amount of charge that comes from noise, while the sample charge level includes charge from noise and incident light. The reset charge level may be subtracted from the sample charge level to isolate the amount of charge associated with the incident light.

In order to obtain the reset charge level, TX2 and RST may be asserted at $t_2$. This clears any excess charge from transfer diode 44 and floating diffusion region 46 and provides a fully depleted charge transfer path. After resetting the charge at TD 44 and FD 46, the charge at FD 46 may be sampled by asserting a sample and hold reset signal (SHR) at $t_3$. This results in the reset charge level of FD 46 being sampled. Next, the charge from photodiode 42 may be transferred to floating diffusion region 46 by asserting TX1 and TX2 at $t_4$. After the charge has been transferred to the floating diffusion region, the charge may be sampled by asserting a sample and hold signal (SHS) at $t_5$.

Figure 5:
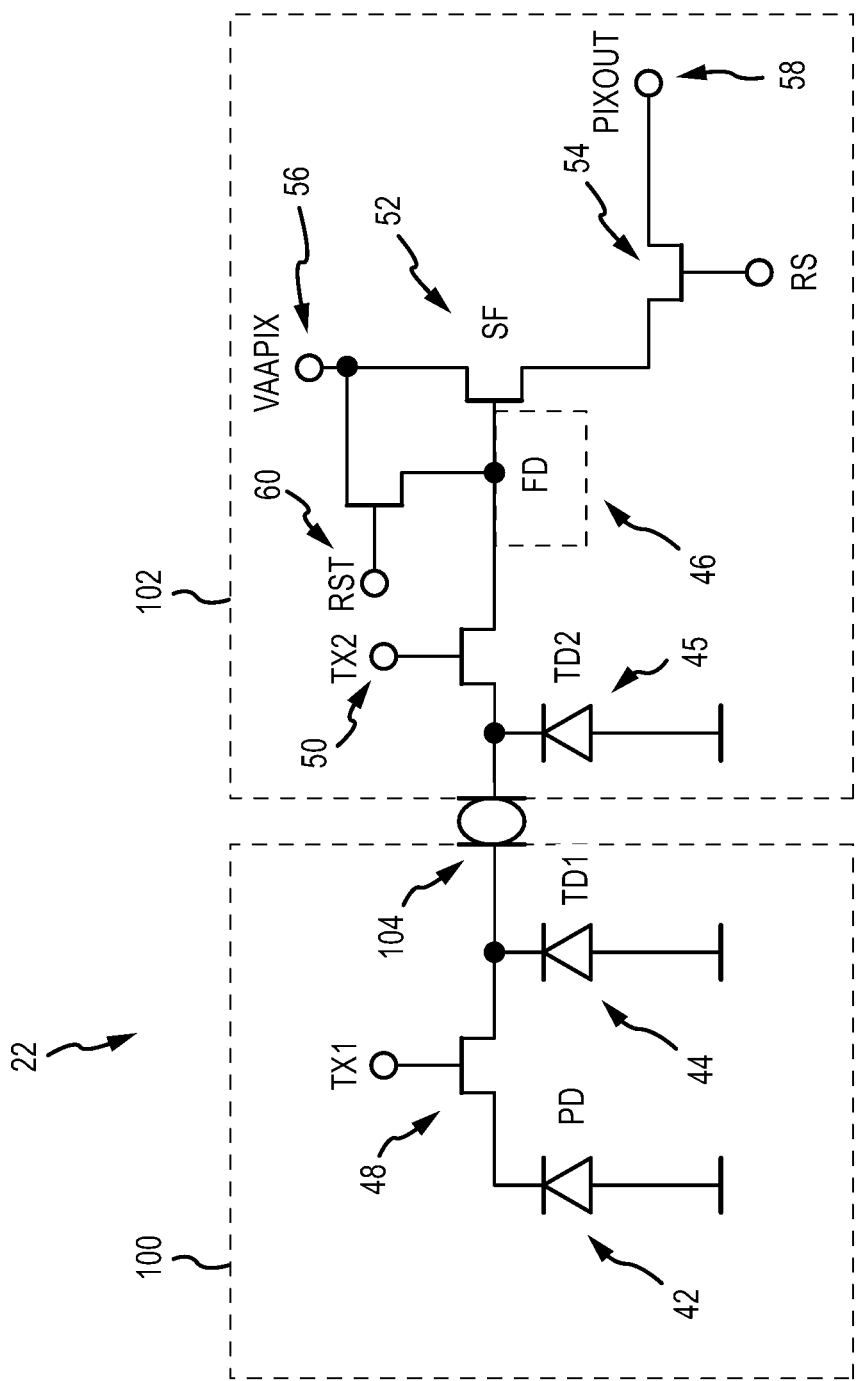
FIG. 5 is a diagram of an illustrative imaging pixel with a fully depleted charge transfer path and an interconnect layer in accordance with an embodiment of the present invention.

FIG. 5 shows an illustrative image pixel with a fully depleted charge transfer path and an interconnect layer. Pixel 22 in FIG. 5 may be similar to pixel 22 in FIG. 3. However, pixel 22 in FIG. 5 may be implemented in two different substrate layers. As shown in FIG. 5, an upper substrate layer 100 in pixel 22 may be connected to a lower substrate layer 102. Upper and lower substrate layers 100 and 102 may be crystalline silicon or any other desired material. An interconnect layer may be used to connect upper substrate layer 100 to lower substrate layer 102. Interconnect layer 104 may be formed from a charge depleted material to ensure that there is a fully depleted charge transfer path between PD 42 and FD 46. The interconnect may be formed from any desired material (e.g., charge depleted polymer, charge depleted silicon, charge depleted germanium, etc.).

Additionally, in order to ensure that charge from photodiode 42 is fully transferred to floating diffusion region 46, an additional transfer diode 45 (TD2) may be included in pixel 22. Transfer diode 45 may be a pinned photodiode with a higher potential than TD1 but a lower potential than FD 46 ($V_{PD}<V_{TD1}<V_{TD2}<V_{FD}$). Pixel 22 of FIG. 5 may be operated using the timing scheme shown in FIG. 4.

Figure 6:
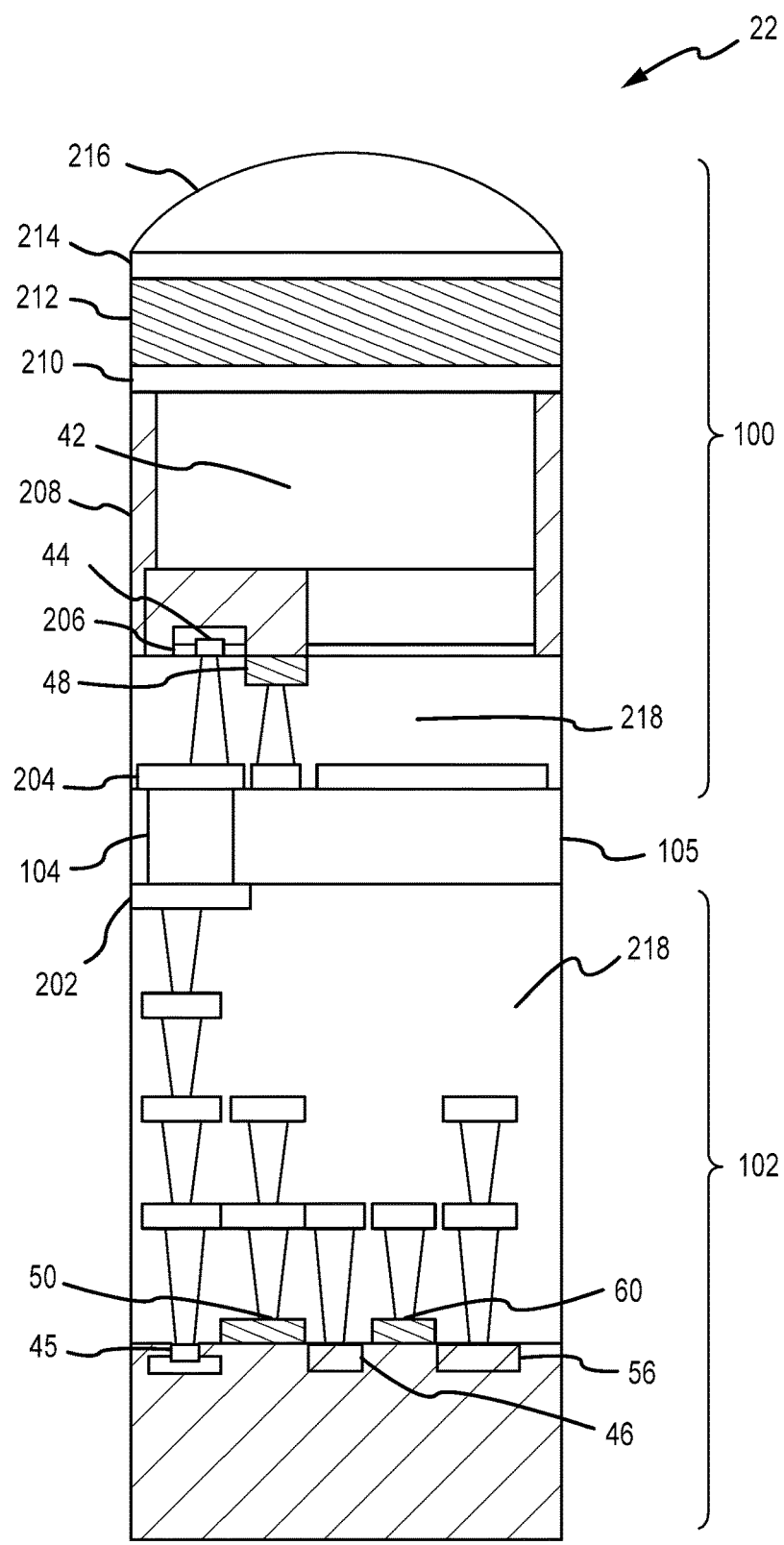
FIG. 6 is a cross-sectional side view of an illustrative imaging pixel with a fully depleted charge transfer path and an interconnect layer in accordance with an embodiment of the present invention.

FIG. 6 is a cross-sectional side view of an illustrative image pixel with an interconnect layer such as pixel 22 in FIG. 5. As shown in FIG. 6, transfer diode 45 (TD2), transfer transistor 50 (TX2), floating diffusion region 46, reset transistor 60, and bias voltage 56 may be formed in lower substrate 102. Lower substrate 102 may also include a metal light shield 202. Interconnect layer 104 may be positioned to couple the upper substrate to the lower substrate. Interconnect layer 104 may be formed in interlayer dielectric 105. Dielectric layer 105 may be non-transparent or opaque to prevent light from reaching TD2 and FD in the lower substrate.

Upper substrate 100 may include photodiode 42, transfer diode 44 (TD1), and transfer transistor 48 (TX1). Upper substrate 100 may also include a metal layer 204 that shields the lower layer from incident light. Metal layer 204 may also reflect incident light back into photodiode 42 which will increase the amount of incident light captured by photodiode 42. A p-type pinning layer 206 may be formed in the upper substrate, along with pixel isolation regions 208. Isolation regions 208 may be formed from p-type doped silicon, as an example. A passivation layer 210, which may act as an anti-reflective coating, may be formed above photodiode 42. Similarly, a color filter element 212, planarization layer 214, and microlens 216 may be formed above photodiode 42. Pixel 22 may also include dielectric material with metal interconnect layers 218 in each substrate. If desired, transfer transistor 48 (TX1) may have a circular gate that laterally surrounds transfer diode 45 (TD).

Figure 7:
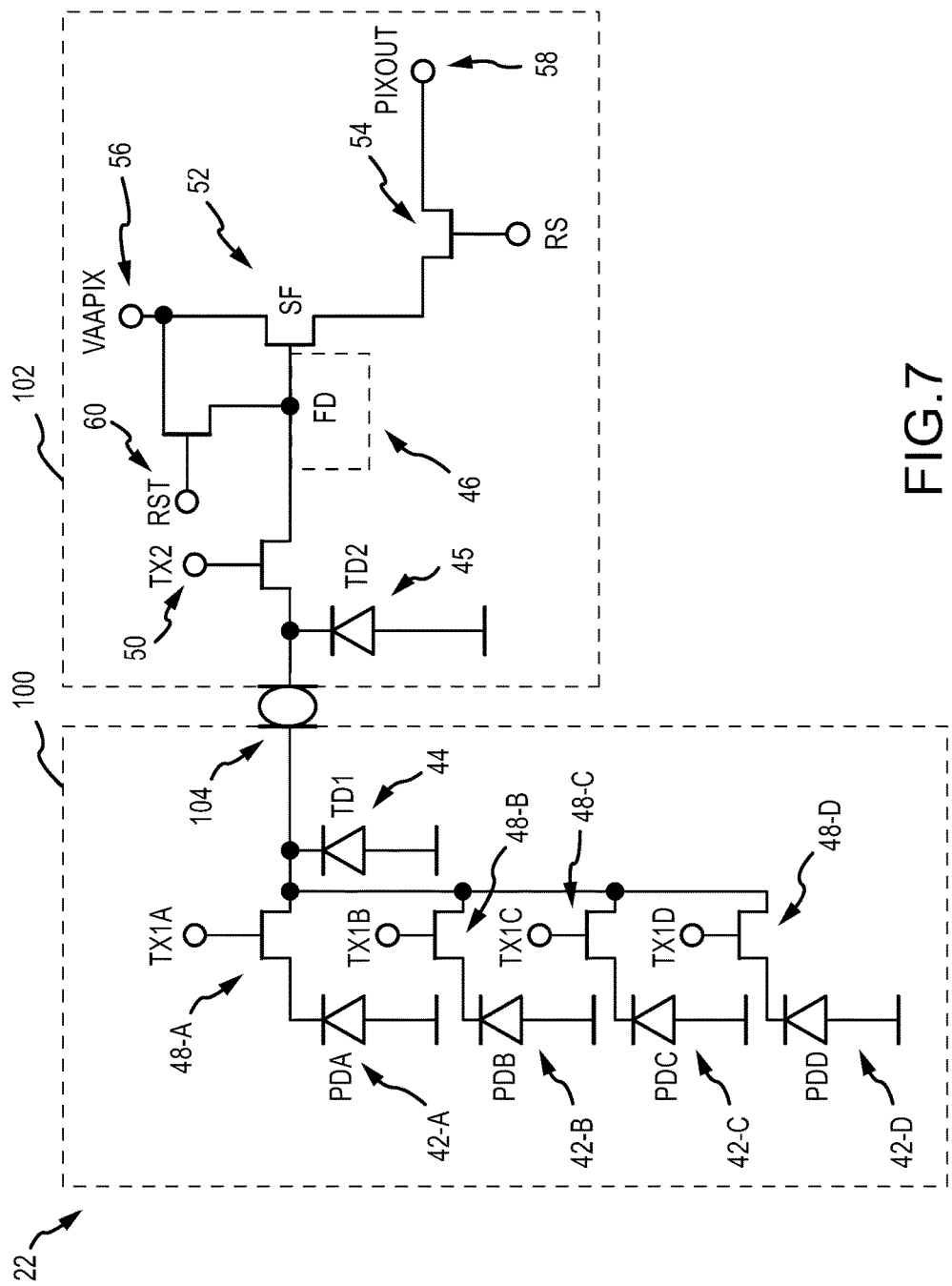
FIG. 7 is a diagram of an illustrative imaging pixel with a fully depleted charge transfer path, an interconnect layer, and a shared configuration in accordance with an embodiment of the present invention.

FIG. 7 is a diagram of an illustrative pixel with a fully depleted charge transfer path and a 4-way shared configuration. As shown in FIG. 7, pixel 22 in FIG. 7 may be similar to pixel 22 in FIG. 5. Specifically, lower substrate 102 with TD2, TX2, RST, FD, and RS may be the same as shown in FIG. 5. However, upper substrate 100 may include multiple photodiodes and transfer transistors that share transfer diode TD1. As shown, photodiode 42-A (PDA) may be coupled to transfer transistor 48-A (TX1A), photodiode 42-B (PDB) may be coupled to transfer transistor 48-B (TX1B), photodiode 42-C (PDC) may be coupled to transfer transistor 48-C (TX1C), and photodiode 42-D (PDD) may be coupled to transfer transistor 48-D (TX1D). Transfer transistors 48-A, 48-B, 48-C, and 48-D may all be coupled to transfer diode 44 (TD1). With this configuration, four different photodiodes may share readout circuitry. This example of sharing various components is merely illustrative, and other arrangements of pixels with shared components may be used if desired.

Figure 8:
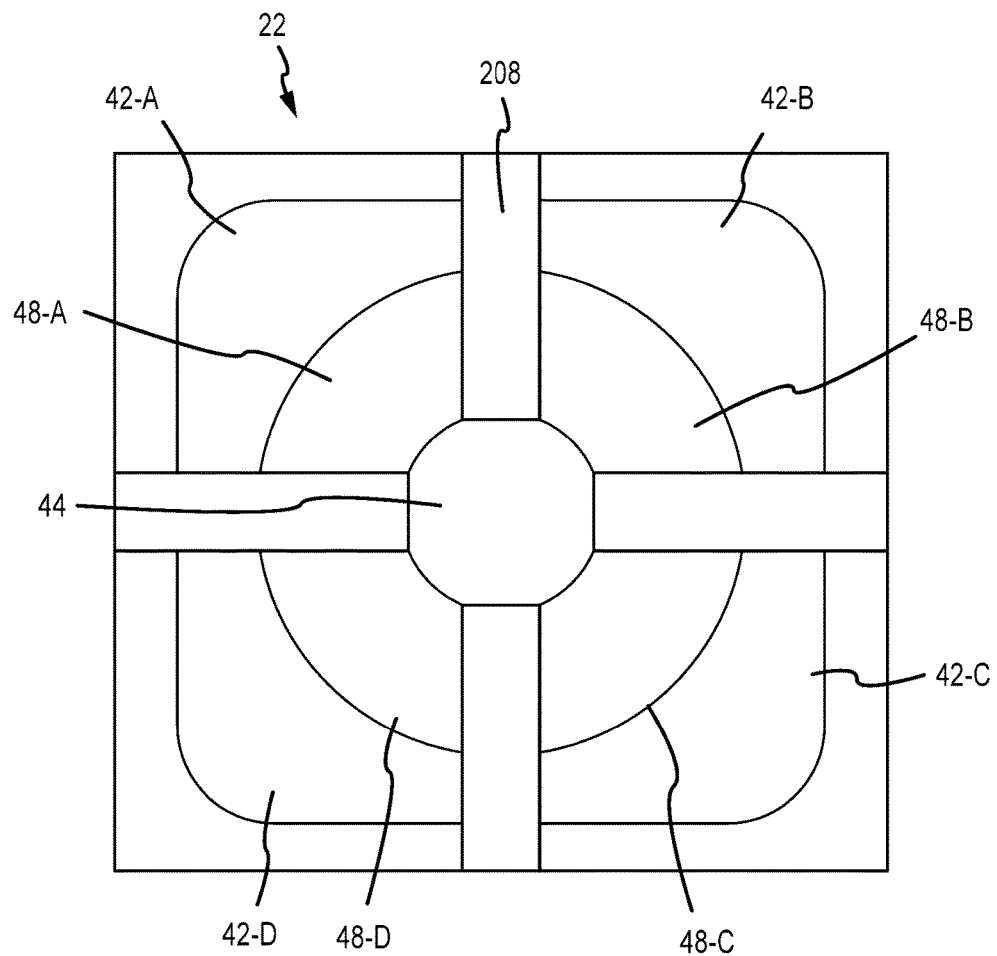
FIG. 8 is a cross-sectional top view of an illustrative imaging pixel with multiple photodiodes that share a transfer diode in accordance with an embodiment of the present invention.

FIG. 8 is a cross-sectional top view of a pixel with a shared transfer diode such as the pixel shown in FIG. 7. As shown, transfer diode 44 (TD1) may be centrally positioned between transfer transistors 48-A, 48-B, 48-C, and 48-D. Transfer transistor 48-A may be configured to couple transfer diode 44 to photodiode 42-A, transfer transistor 48-B may be configured to couple transfer diode 44 to photodiode 42-B, transfer transistor 48-C may be configured to couple transfer diode 44 to photodiode 42-C, and transfer transistor 48-D may be configured to couple transfer diode 44 to photodiode 42-D.

Figure 9:
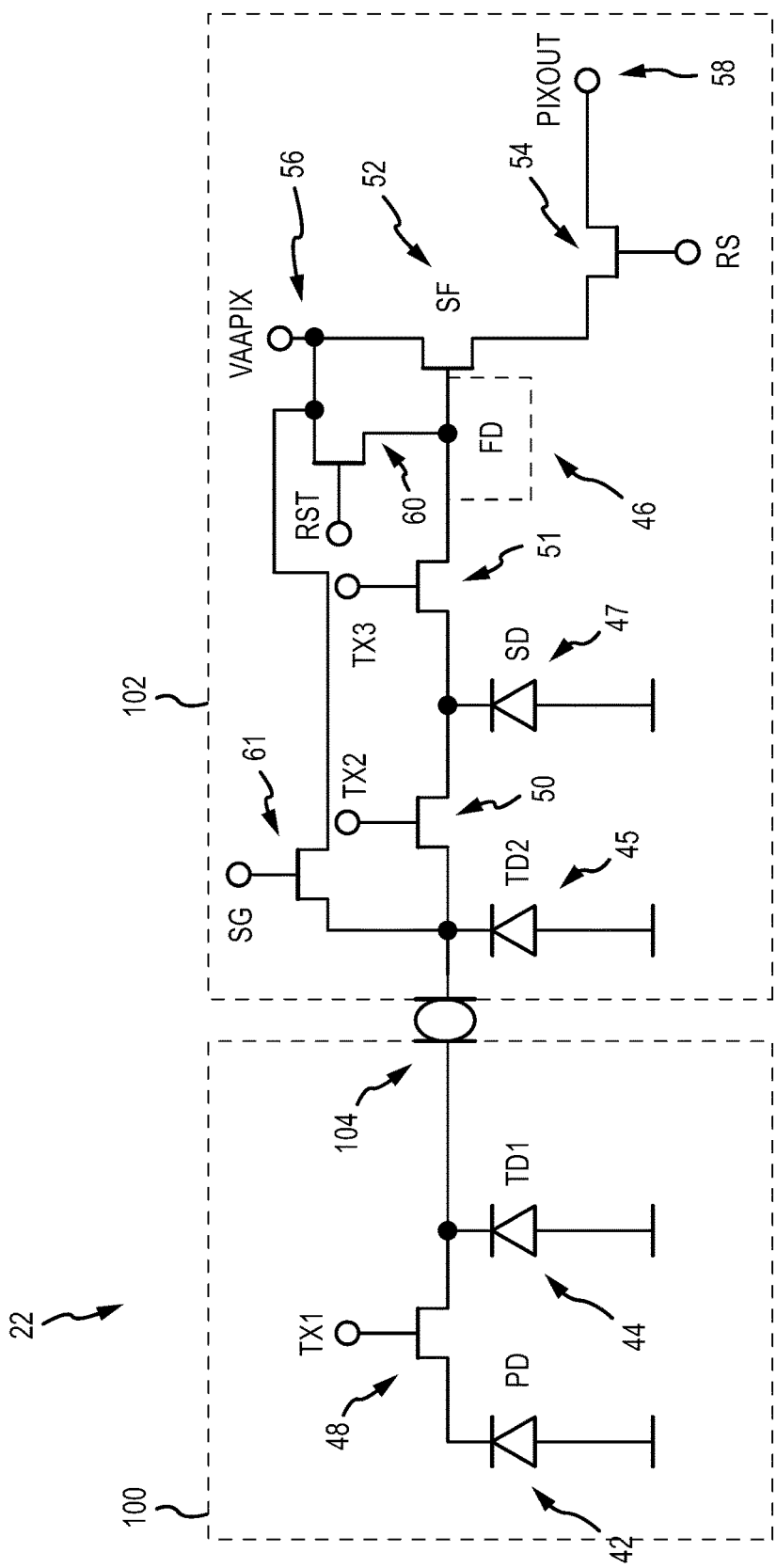
FIG. 9 is a diagram of an illustrative imaging pixel with a fully depleted charge transfer path, an interconnect layer, and a storage diode in accordance with an embodiment of the present invention.

FIG. 9 is a diagram of an illustrative pixel with a fully depleted charge transfer path, an interconnect layer, and a storage diode. Pixel 22 of FIG. 9 may be similar to pixel 22 of FIG. 5. For example, upper substrate 100 in FIG. 9 with photodiode 42, transfer diode 44, and transfer transistor 48 may be the same as the upper substrate shown in FIG. 5. However, FIG. 9 may have additional components in lower substrate 102.

First, lower substrate 102 of pixel 22 in FIG. 9 includes a storage diode 47 (SD). The storage diode may be coupled between transfer diode 45 and floating diffusion region 46. Accordingly, transfer transistor 50 may transfer charge from transfer diode 45 to storage diode 47 when asserted. An additional transfer transistor 51 (TX3) may be provided. Transfer transistor 51 may transfer charge from storage diode 47 to floating diffusion region 46 when asserted. Storage diode 47 be a pinned diode with a potential that is higher than the potential of TD2 but lower than the potential of FD ($V_{PD}<V_{TD1}<V_{TD2}<V_{SD}<V_{FD}$). Storage diode 47 may be used to store charge during global shutter operation.

Pixel 22 in FIG. 9 may also include a transistor 61 (SG) coupled between transfer diode 45 and bias voltage 56. When transistor 61 is asserted, charge from transfer diodes 44 and 45 may be cleared from the pixel. If transistors 48 and 61 are simultaneously asserted, charge from photodiode 42, transfer diode 44, and transfer diode 45 may be cleared from the pixel. Transistor 61 may be used to implement flicker mitigation and global shutter operations and may sometimes be referred to as a shutter gate.

In imaging systems, image artifacts may be caused by moving objects, flickering lighting, and objects with changing illumination in an image frame. Such artifacts may include, for example, missing parts of an object, edge color artifacts, and object distortion. Examples of objects with changing illumination include light-emitting diode (LED) traffic signs (which can flicker several hundred times per second) and LED brake lights or headlights of modern cars. Zones in an image frame that are not fully exposed to dynamic scenery may result in object distortion, ghosting effects, and color artifacts when the scenery includes moving or fast-changing objects. Similar effects may be observed when the camera is moving or shaking during image capture operations. In order to capture images with minimized artifacts related to flickering lighting and objects with changing illumination, flicker mitigation (FM) techniques may be used.

Figure 10:
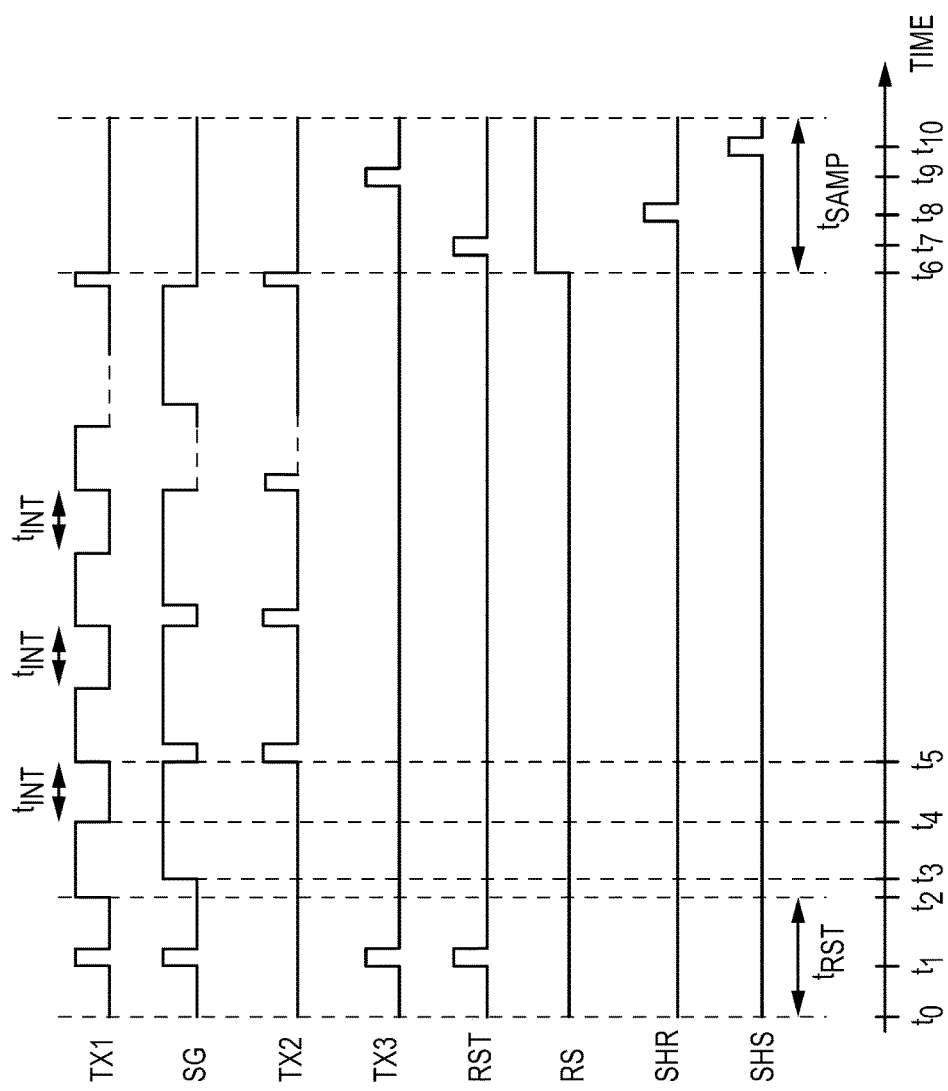
FIG. 10 is a timing diagram showing how an illustrative imaging pixel with a fully depleted charge transfer path and a storage diode may be operated in accordance with an embodiment of the present invention.

FIG. 10 is a timing diagram illustrating how dynamic shutter operation for flicker mitigation may be implemented in pixel 22. As shown in FIG. 10, shutter gate SG may be asserted multiple times during an image frame.

First, transfer transistor 48 (TX1), transfer transistor 51 (TX3), shutter gate 61 (SG), and reset transistor 60 (RST) may be asserted at $t_1$. This resets the charge at photodiode 42, transfer diodes 44 and 45, storage diode 47, and floating diffusion 46 during a reset period $t_{RST}$.

After $t_{RST}$, charge may accumulate in photodiode 42 during acquisition periods $t_{INT}$. As shown, TX1 may be asserted at $t_2$ and SG may be asserted at $t_3$. When both TX1 and SG are asserted, charge cannot accumulate in photodiode 42. When transistors 48 and 61 are asserted simultaneously, the photodiode and transfer diodes will be cleared of all charge. Next, at $t_4$ TX1 may be turned off, allowing charge to accumulate in photodiode 42. Charge may accumulate during this integration time $t_{INT}$ until $t_5$. At $t_5$, transfer transistor TX1 may be asserted, transfer transistor TX2 may be asserted, and shutter gate SG may be turned off. This may result in the accumulated charge from photodiode 42 being transferred to storage diode 47. This pattern may be repeated so that a total integration time T is split amongst shorter integration times $t_{INT}$.

After the acquisition period is complete (at $t_6$), the charge from the various integration times ($t_{INT}$) will have been summed at storage diode 47. A correlated double sampling readout may then take place to read out the charge from storage diode 47. The row select transistor may be asserted at $t_6$. In order to obtain the reset charge level, RST may be asserted at $t_7$. This clears any excess charge from floating diffusion region 46. After resetting the charge at FD 46, the charge at FD 46 may be sampled by asserting a sample and hold reset signal (SHR) at $t_8$. This results in the reset charge level of FD 46 being sampled. Next, the charge from storage diode 47 may be transferred to floating diffusion region 46 by asserting TX3 at $t_9$. After the charge has been transferred to the floating diffusion region, the charge may be sampled by asserting a sample and hold signal (SHS) at $t_{10}$.

Because $t_{INT}$ is much shorter than the length of an image frame, multiple shutter cycles may fit into a portion of a frame length or into the entire frame length without compromising pixel exposure timing (i.e., while maintaining the desired total pixel exposure time T).

By breaking up the total exposure time T during an image frame into shorter, non-continuous integration periods, image artifacts caused by moving objects, flickering lighting, and objects with changing illumination may be minimized without compromising pixel exposure time (i.e., while maintaining the desired total exposure time T). The timing of shutter pulses (and accompanying integration times) may have any suitable pattern or lengths.

In FIG. 9, the shutter gate (SG) was shown as being coupled between transfer diode 45 and bias voltage 56. It should be noted that this example is merely illustrative, and the shutter gate may be positioned elsewhere in the pixel if desired. For example, the shutter gate may be coupled directly to the photodiode in the upper substrate. However, the arrangement of FIG. 9 may enable photodiode size to be maximized (since SG does not take up space in the upper substrate) and reduce dark current in the pixel.

Figure 11:
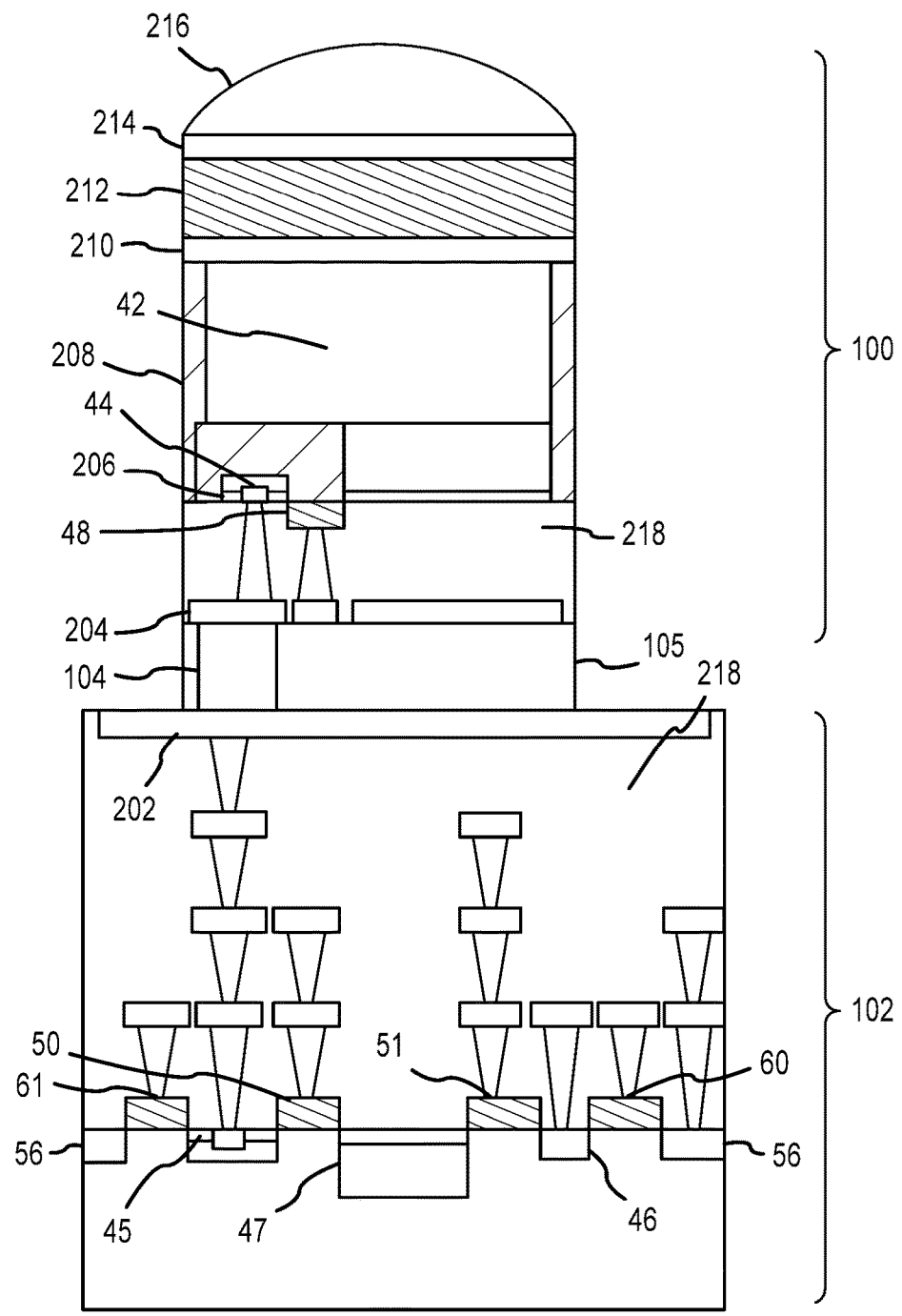
FIG. 11 is a cross-sectional side view of an illustrative imaging pixel with a fully depleted charge transfer path, an interconnect layer, and a storage diode in accordance with an embodiment of the present invention.

FIG. 11 is a cross-sectional side view of an illustrative pixel with a fully depleted charge transfer path, an interconnect layer, and a storage diode, such as pixel 22 in FIG. 9. As shown in FIG. 11, lower substrate 102 may include bias voltage supply line 56, transistor 61, transfer diode 45 (TD2), transfer transistor 50 (TX2), storage diode 47, transfer transistor 51 (TX3), floating diffusion region 46, and reset transistor 60. Lower substrate 100 may also include metal shielding layer 202. Interconnect layer 104 may be formed in interlayer dielectric 105 and connect the lower substrate to upper substrate 100. Upper substrate 100 may include p-type pinning layer 206, isolation regions 208, transfer diode 44 (TD1), transfer transistor 48 (TX1), and photodiode 42. Passivation layer 210, color filter 212, planarization layer 214, and microlens 216 may be formed above photodiode 42. Pixel 22 may also include dielectric material with metal interconnect layers 218 in each substrate.

Figure 12:
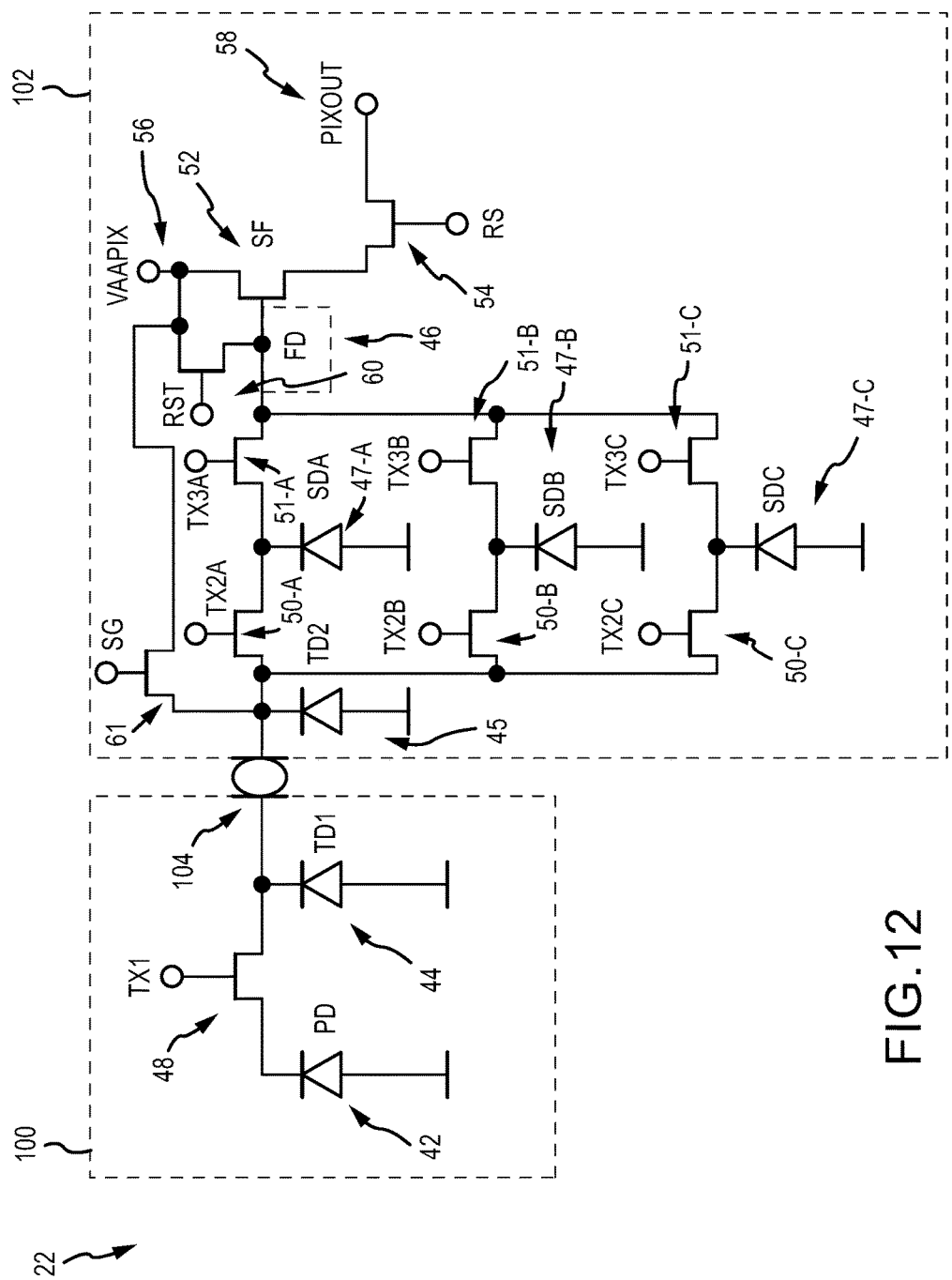
FIG. 12 is a diagram of an illustrative imaging pixel with a fully depleted charge transfer path, an interconnect layer, and multiple storage diodes in accordance with an embodiment of the present invention.

FIG. 12 is a diagram of an illustrative pixel with a fully depleted charge transfer path, an interconnect layer, and multiple storage diodes. Pixel 22 of FIG. 12 may be similar to pixel 22 of FIG. 9. However, pixel 22 of FIG. 12 may have multiple storage diodes in lower substrate 102.

As shown in FIG. 12, storage diode 47-A (SDA) may be coupled between transfer transistor 50-A (TX2A) and transfer transistor 51-A (TX3A), storage diode 47-B (SDB) may be coupled between transfer transistor 50-B (TX2B) and transfer transistor 51-B (TX3B), and storage diode 47-C (SDC) may be coupled between transfer transistor 50-C (TX2C) and transfer transistor 51-C (TX3C). The multiple storage diodes may be used to implement a wide range of functionality depending on the specific application of the imaging pixel. The example of FIG. 12 shows three storage diodes in lower substrate 102. This example is merely illustrative, and any number of storage diodes may be included in the lower substrate (e.g., one, two, three, four, more than four, etc.).

In one illustrative example, pixel 22 of FIG. 12 may be used for high dynamic range (HDR) flicker mitigation (FM) operation. As previously discussed, flicker mitigation may be useful to eliminate artifacts in certain settings. An image sensor with a low dynamic range may also have artifacts, as portions of the image may be over exposed or under exposed. High dynamic range can reduce these artifacts and improve image quality.

Figure 13:
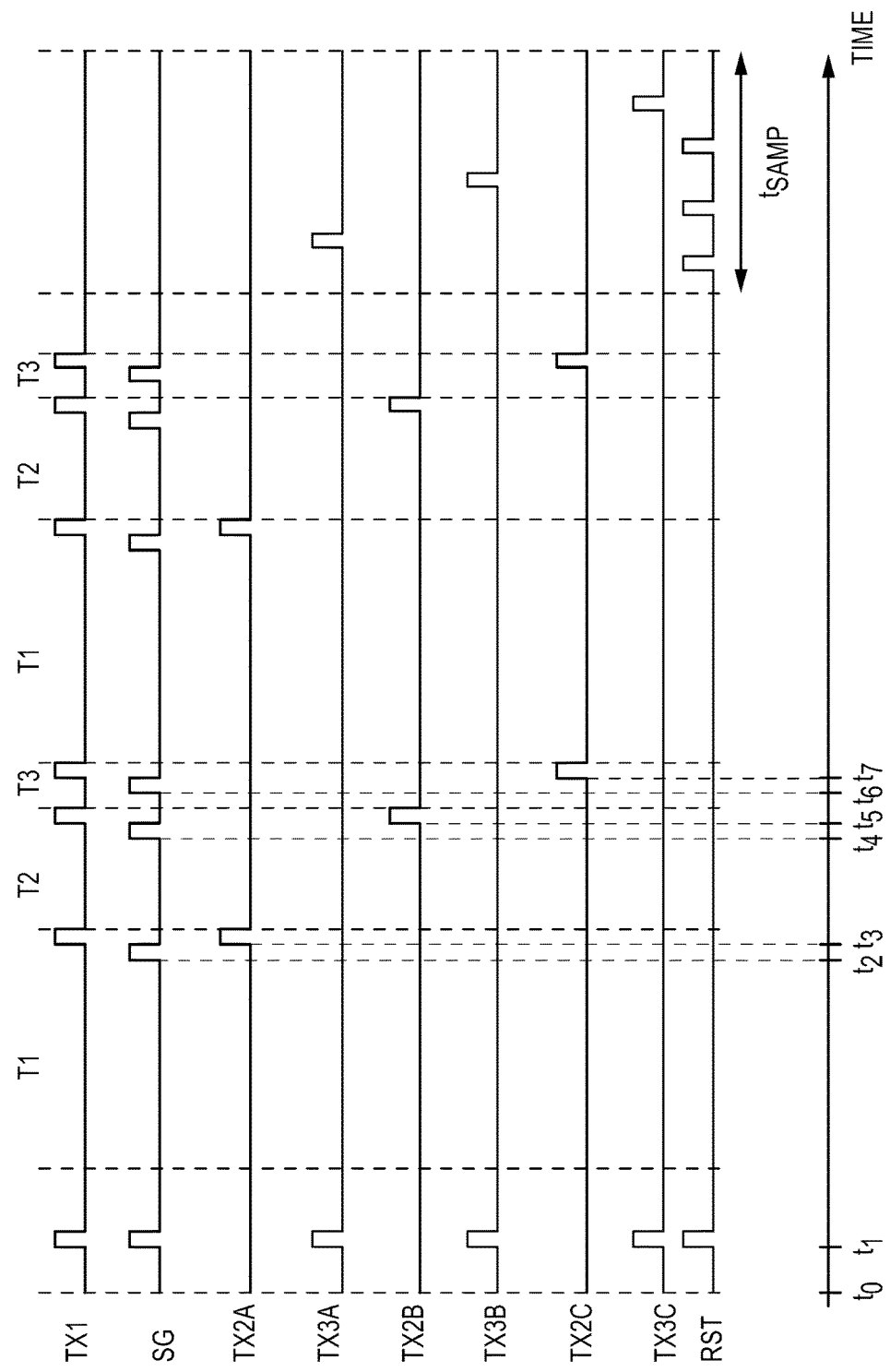
FIG. 13 is a timing diagram showing how an illustrative imaging pixel with a fully depleted charge transfer path and multiple storage diodes may be operated in a high dynamic range flicker mitigation mode in accordance with an embodiment of the present invention.

FIG. 13 is a diagram of an illustrative timing scheme for asserting various transistors in HDR FM operation of pixel 22. At $t_1$, transfer transistor 48 (TX1), shutter gate 61 (SG), reset transistor 60, transfer transistor 51-A (TX3A), transfer transistor 51-B (TX3B), and transfer transistor 51-C (TX3C) may be asserted. This may clear photodiode 42, transfer diodes 44 and 45, storage diodes 47-A, 47-B, and 47-C, and floating diffusion region 46 of charge.

After reset, charge may accumulate in photodiode 42. At $t_2$, SG may be asserted to ensure that TD1 and TD2 are clear of any excess charge. TX1 and TX2A may then be simultaneously asserted at $t_3$. When TX1 and TX2A are asserted, the charge from photodiode 42 that accumulated during integration time T1 may be transferred to storage diode 47-A. At $t_4$, the shutter gate may be asserted to reset TD1 and TD2. Then, TX1 and TX2B may be asserted at $t_5$. When TX1 and TX2B are asserted, the charge from photodiode 42 that accumulated during integration time T2 may be transferred to storage diode 47-B. At $t_6$, the shutter gate may be asserted to reset TD1 and TD2. Then, TX1 and TX2C may be asserted at $t_7$. When TX1 and TX2C are asserted, the charge from photodiode 42 that accumulated during integration time T3 may be transferred to storage diode 47-C.

This pattern may be repeated for multiple cycles (where each cycle includes T1, T2, and T3). During each cycle, the charge from T1 will be added to storage diode 47-A, the charge from T2 will be added to storage diode 47-B, and the charge from T3 will be added to storage diode 47-C. Each T1 may be longer than each T2, while each T2 may be longer than each T3. By using integration times T1, T2, and T3 of varying lengths, a high dynamic range image may be obtained. Additionally, the total integration times for each storage diode are split amongst a number of shorter integration times, therefore achieving flicker mitigation.

After accumulating charge in each storage diode, readout can occur during $t_{SAMP}$. Each storage diode may be read out using correlated double sampling, as shown and described in connection with FIG. 10. The readout process in FIG. 13 is the same as the readout process in FIG. 10, except that transfer transistor TX3A is asserted to readout storage diode SDA, transfer transistor TX3B is asserted to readout storage diode SDB, and transfer transistor TX3C is asserted to readout storage diode SDC.

Figure 14:
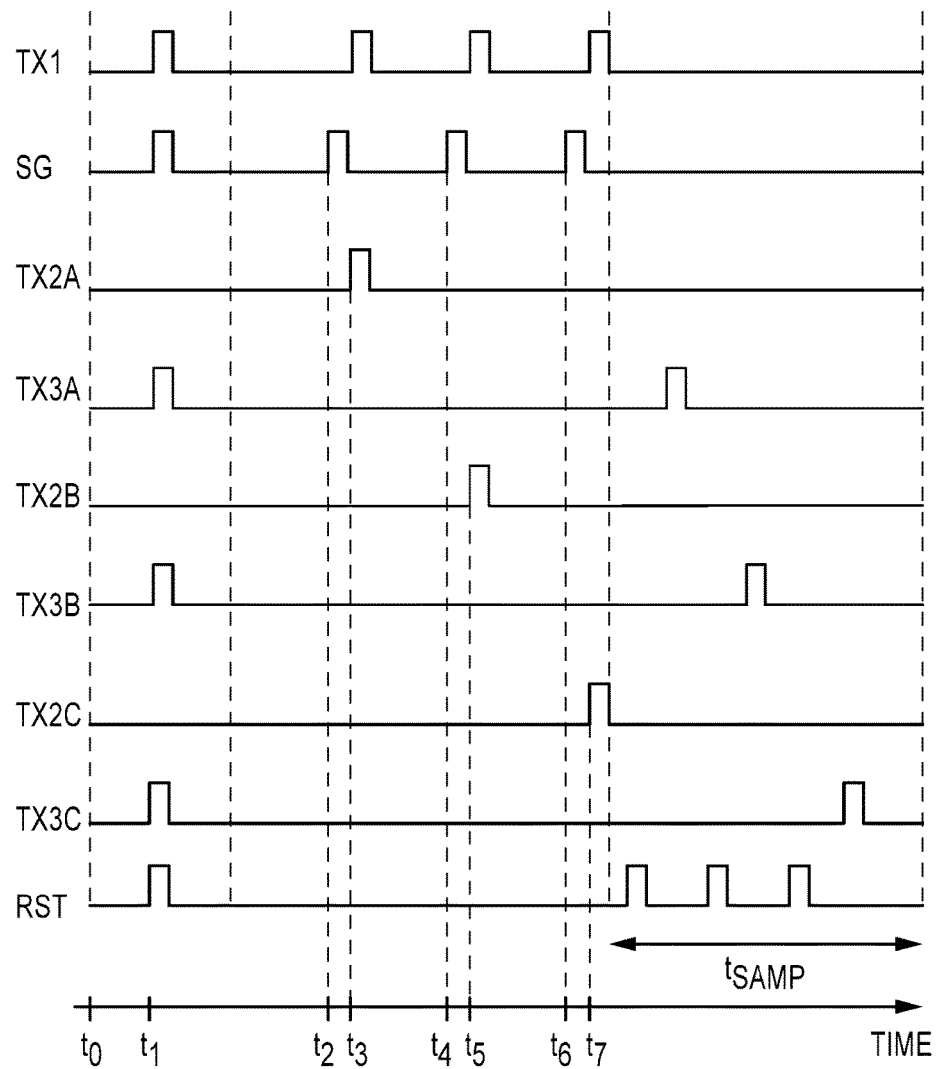
FIG. 14 is a timing diagram showing how an illustrative imaging pixel with a fully depleted charge transfer path and multiple storage diodes may be operated in a high frame rate mode in accordance with an embodiment of the present invention.

FIG. 14 is a diagram of an illustrative timing scheme for asserting various transistors in pixel 22. The timing diagram for pixel 22 in FIG. 14 shows how pixel 22 may be used for very high frames per second (FPS) operation. Pixel 22 may capture images at over 100,000 frames per second, over 1,000,000 frames per second, over 2,000,000, frames per second, or any other desired frame rate. Because pixel 22 uses a fully depleted charge transfer path and transfers charge throughout operation, the images can be sampled and read out very quickly, enabling a very high frame rate.

FIG. 14 shows that a reset may occur at $t_1$ (similar to the reset described in connection with FIG. 13). Charge may then accumulate in the photodiode. At $t_2$, shutter gate (SG) may be pulsed to clear TD1 and TD2 of excess charge. The charge from photodiode 42 may then be transferred to storage diode 47-A by asserting transfer transistor 48 and transfer transistor 50-A at $t_3$. Charge may then accumulate in the photodiode. At $t_4$, shutter gate (SG) may be pulsed to clear TD1 and TD2 of excess charge. The charge from photodiode 42 may then be transferred to storage diode 47-B by asserting transfer transistor 48 and transfer transistor 50-B at $t_5$. Charge may then accumulate in the photodiode. At $t_6$, shutter gate (SG) may be pulsed to clear TD1 and TD2 of excess charge. The charge from photodiode 42 may then be transferred to storage diode 47-C by asserting transfer transistor 48 and transfer transistor 50-C at $t_7$. After accumulating charge in each storage diode, readout can occur during $t_{SAMP}$. Each storage diode may be read out using correlated double sampling, as shown and described in connection with FIGS. 10 and 13.

Figure 15:
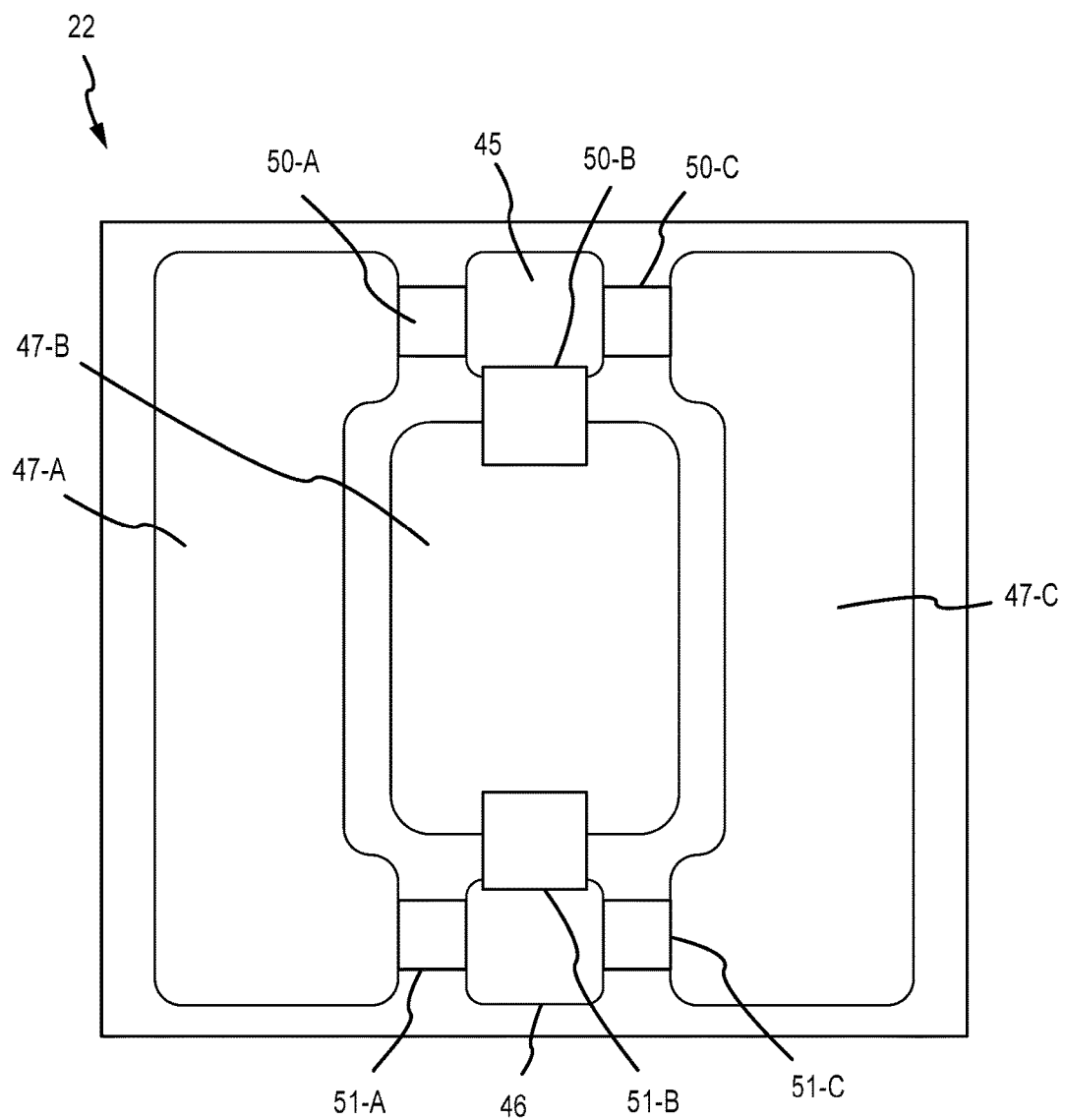
FIG. 15 is a cross-sectional top view showing an illustrative imaging pixel with multiple storage diodes of the same size in accordance with an embodiment of the present invention.
Figure 16:
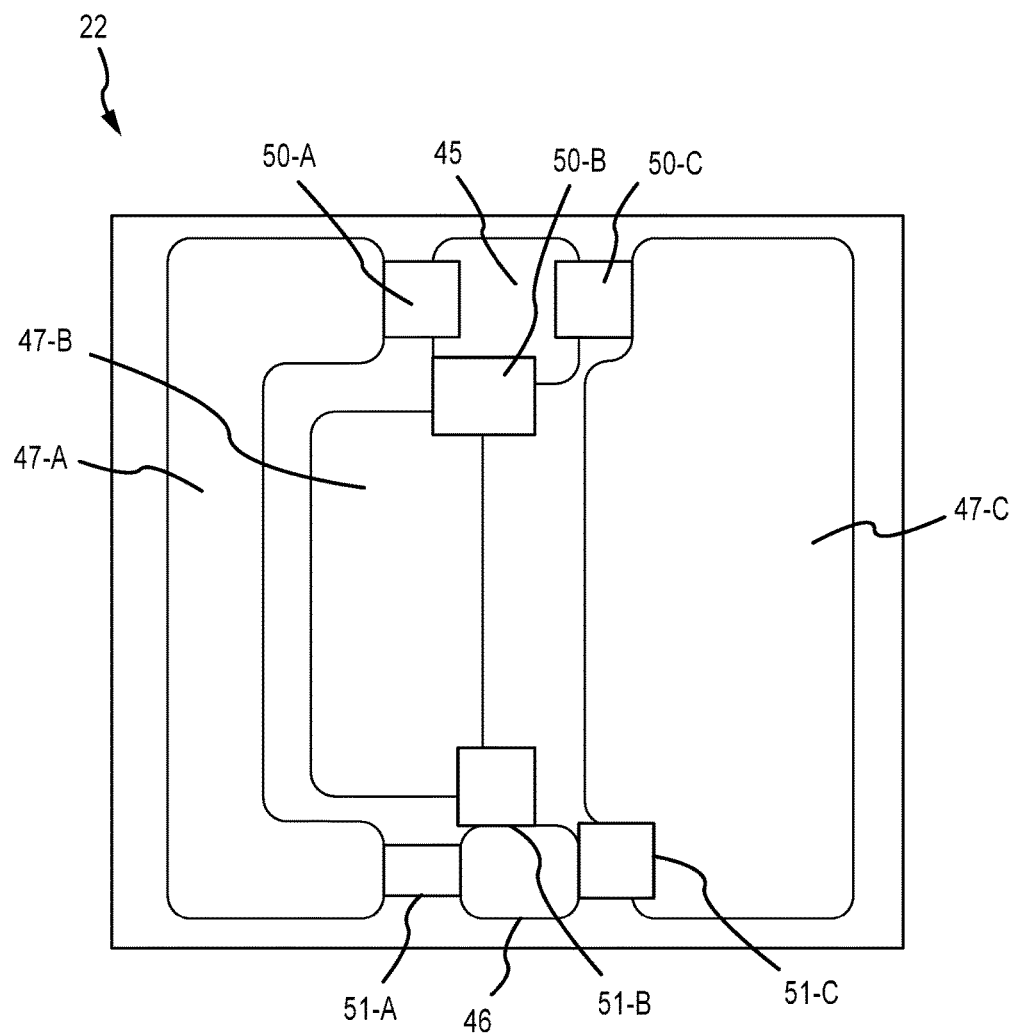
FIG. 16 is a cross-sectional top view showing an illustrative imaging pixel with multiple storage diodes of different sizes in accordance with an embodiment of the present invention.

FIGS. 15 and 16 are cross-sectional top views of image pixels such as image pixel 22 in FIG. 12. The pixels in FIGS. 15 and 16 each have three storage diodes (47-A, 47-B, and 47-C). However, the storage diodes may have different sizes and shapes depending on the design considerations of the pixel. FIG. 15 shows an example where storage diodes 47-A, 47-B, and 47-C each take up the same amount of area of the pixel. Accordingly, the storage diodes may have the same capacity. In another arrangement, however, the storage diodes may have different sizes. In FIG. 16, for example, storage diode 47-A is smaller than storage diode 47-B, and storage diode 47-B is smaller than storage diode 47-C. An arrangement of this sort may be helpful in a scenario where storage diode 47-C is expected to store more charge than the other storage diodes. In general each storage diode may have any desired size and shape.

A pixel of the type shown in FIG. 12 may be used to image multiple types of light using the same pixel. For example, there may be a pixel similar to the pixel shown in FIG. 12 but with only two storage diodes. The pixel may obtain a first image containing background and store the charge in the first storage diode. Then, a second image may be obtained while a known pulse of infrared (IR) light is emitted. The charge from the second image containing IR illuminated and background may be stored in the second storage diode. The first image data may be subtracted from the second image data during processing to obtain an infrared image. Pixels 22 may be used for other applications of this variety, depending on the application of the particular image sensor.

Figure 17:
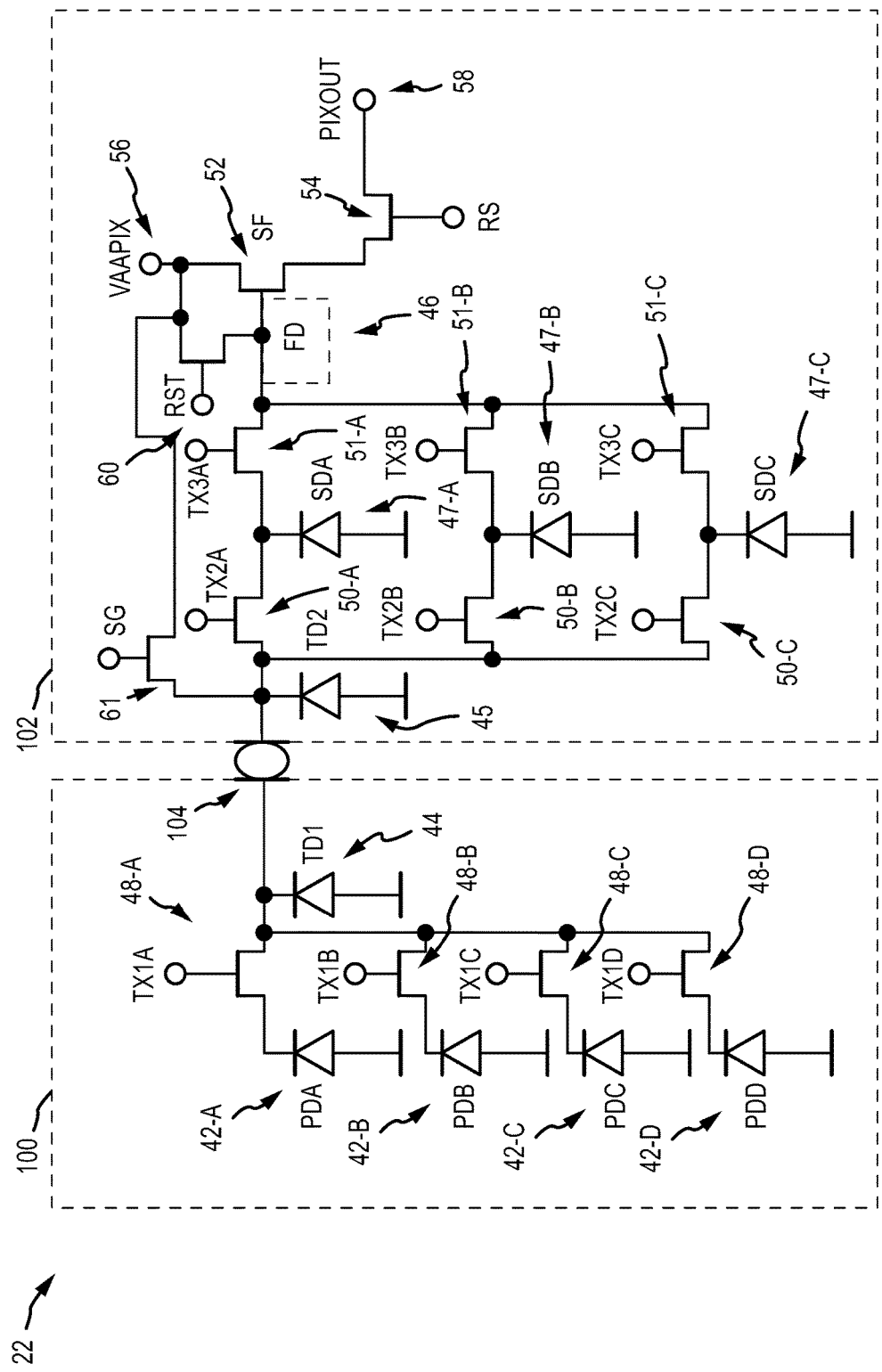
FIG. 17 is a diagram of an illustrative imaging pixel with a fully depleted charge transfer path, an interconnect layer, multiple storage diodes, and a shared configuration in accordance with an embodiment of the present invention.

FIG. 17 is a diagram of an illustrative image pixel with a fully depleted charge transfer path, an interconnect layer, multiple storage diodes, and a shared configuration. As shown in FIG. 17, lower substrate may be the same as lower substrate 102 of FIG. 12. In addition, the storage diodes may be shared among a number of photodiodes in upper substrate 100. Upper substrate 100 in FIG. 17 may be the same as upper substrate 100 in FIG. 7. The pixel shown in FIG. 17 has a wide range of functionality and can be used in a variety of ways depending on the specific application of the image sensor. Charges from different photodiodes may be summed in any possible combination in the storage diodes. For example, the charge from each photodiode could be summed in a single storage diode. Alternatively, the charge from PDA and PDB may be stored in SDA, while the charge from PDC and PDD may be stored in SDB.

In various embodiments of the invention, an imaging pixel may include a pinned photodiode with a first potential, a pinned transfer diode with a second potential, a floating diffusion region with a third potential, a first transfer transistor coupled between the pinned photodiode and the pinned transfer diode, and a second transfer transistor coupled between the pinned transfer diode and the floating diffusion region. The first transfer transistor, the pinned transfer diode, and the second transfer transistor form a fully depleted charge transfer path between the pinned photodiode and the floating diffusion region. The second potential may be higher than the first potential, and the third potential may be higher than the second potential.

The pinned photodiode and pinned transfer diode may be formed in an upper substrate. The floating diffusion region may be formed in a lower substrate. The imaging pixel further may also include an interconnect layer that couples the upper substrate to the lower substrate. The interconnect layer may be formed in an opaque dielectric layer. The imaging pixel may also include an additional pinned transfer diode that is formed in the lower substrate, and the interconnect layer may couple the pinned transfer diode in the upper substrate to the additional pinned transfer diode in the lower substrate. The additional pinned transfer diode may have a fourth potential that is higher than the second potential and lower than the third potential.

The imaging pixel may also include a storage diode with a fifth potential and a third transfer transistor coupled between the storage diode and the floating diffusion region. The fifth potential may be higher than the fourth potential and lower than the third potential. The second transfer transistor may be coupled between the additional pinned transfer diode and the storage diode. The first transfer transistor may be configured to transfer charge from the pinned photodiode to the pinned transfer diode when asserted, the second transfer transistor may be configured to transfer charge from the additional pinned transfer diode to the storage diode when asserted, and the third transfer transistor may be configured to transfer charge from the storage diode to the floating diffusion region when asserted.

The storage diode may be a first storage diode, and the imaging pixel may also include a second storage diode, a fourth transfer transistor coupled between the additional pinned transfer diode and the second storage diode, and a fifth transfer transistor coupled between the second storage diode and the floating diffusion region. The imaging pixel may also include a third storage diode, a sixth transfer transistor coupled between the additional pinned transfer diode and the third storage diode, and a seventh transfer transistor coupled between the third storage diode and the floating diffusion region. The first and second storage diodes may have different sizes. The imaging pixel may include at least one additional pinned photodiode that is configured to share the pinned transfer diode with the pinned photodiode.

The interconnect layer may include a metal layer that shields the additional pinned transfer diode and the floating diffusion region from incident light, and the metal layer may act as a reflector for incident light. The first transfer transistor may have a circular gate that laterally surrounds the pinned transfer diode. The imaging pixel may include a plurality of additional pinned photodiodes, and a plurality of additional transfer transistors. Each transfer transistor of the plurality of additional transfer transistors may be coupled between a respective pinned photodiode of the plurality of additional pinned photodiodes and the pinned transfer diode.

In various embodiments, a method of operating an imaging pixel may be provided. The imaging pixel may include a pinned photodiode, a first pinned transfer diode, a second pinned transfer diode, an interconnect layer that couples the first pinned transfer diode to the second pinned transfer diode, a storage diode, a floating diffusion region, a first transfer transistor coupled between the pinned photodiode and the first pinned transfer diode, a second transfer transistor coupled between the second pinned transfer diode and the storage diode, a third transfer transistor coupled between the storage diode and the floating diffusion region, a reset transistor that is coupled between the floating diffusion region and a bias voltage, and a shutter gate that is coupled between the second pinned transfer diode and the bias voltage. The method may include resetting the pinned photodiode, the first pinned transfer diode, the second pinned transfer diode, the storage diode, and the floating diffusion region by asserting the first transfer transistor, the third transfer transistor, the shutter gate, and the reset transistor, and with the photodiode, accumulating charge over a total exposure time that is split into multiple integration periods. The multiple integration periods may be non-continuous and may each be shorter than the total exposure time. The charge that is accumulated in each integration period of the multiple integration periods may be transferred to the storage diode. The method may also include clearing charge from the pinned photodiode, the first pinned transfer diode, and the second pinned transfer diode by asserting the first transfer transistor and the shutter gate after each integration period of the multiple integration periods.

In various embodiments, a method of operating an imaging pixel may be provided. The imaging pixel may include a pinned photodiode, a first pinned transfer diode, a second pinned transfer diode, an interconnect layer that couples the first pinned transfer diode to the second pinned transfer diode, a first storage diode, a second storage diode, and a third storage diode, a floating diffusion region, a first transfer transistor coupled between the pinned photodiode and the first pinned transfer diode, a second transfer transistor coupled between the second pinned transfer diode and the first storage diode, a third transfer transistor coupled between the first storage diode and the floating diffusion region, a fourth transfer transistor coupled between the second pinned transfer diode and the second storage diode, a fifth transfer transistor coupled between the second storage diode and the floating diffusion region, a sixth transfer transistor coupled between the second pinned transfer diode and the third storage diode, a seventh transfer transistor coupled between the third storage diode and the floating diffusion region, a reset transistor that is coupled between the floating diffusion region and a bias voltage, and a shutter gate that is coupled between the second pinned transfer diode and the bias voltage. The method may include resetting the pinned photodiode, the first pinned transfer diode, the second pinned transfer diode, the first storage diode, the second storage diode, the third storage diode, and the floating diffusion region by asserting the first transfer transistor, the third transfer transistor, the fifth transfer transistor, the seventh transistor, the shutter gate, and the reset transistor, accumulating a first amount of charge in the photodiode over a first integration time, transferring the first amount of charge to the first storage diode by asserting the first transfer transistor and the second transfer transistor, accumulating a second amount of charge in the photodiode over a second integration time, transferring the second amount of charge to the second storage diode by asserting the first transfer transistor and the fourth transfer transistor, accumulating a third amount of charge in the photodiode over a third integration time, and transferring the third amount of charge to the third storage diode by asserting the first transfer transistor and the sixth transfer transistor.

The method may also include reading out the charge on the first storage diode using correlated double sampling, reading out the charge on the second storage diode using correlated double sampling, and reading out the charge on the third storage diode using correlated double sampling. The method may also include accumulating a fourth amount of charge in the photodiode over a fourth integration time and transferring the fourth amount of charge to the first storage diode by asserting the first transfer transistor and the second transfer transistor after transferring the third amount of charge to the third storage diode and before reading out the charge on the first storage diode. The first integration time may be longer than the second integration time, and the second integration time may be longer than the third integration time.

The foregoing is merely illustrative of the principles of this invention and various modifications can be made by those skilled in the art without departing from the scope and spirit of the invention.

What is claimed is:

1. An imaging pixel comprising:
   a pinned photodiode with a first potential;
   a pinned transfer diode with a second potential, wherein the second potential is higher than the first potential;
   a floating diffusion region with a third potential, wherein the third potential is higher than the second potential;
   a first transfer transistor coupled between the pinned photodiode and the pinned transfer diode; and
   a second transfer transistor coupled between the pinned transfer diode and the floating diffusion region, wherein the first transfer transistor, the pinned transfer diode, and the second transfer transistor form a fully depleted charge transfer path between the pinned photodiode and the floating diffusion region.

2. The imaging pixel defined in claim 1, wherein the first transfer transistor has a circular gate that laterally surrounds the pinned transfer diode.

3. The imaging pixel defined in claim 1, further comprising:
   a plurality of additional pinned photodiodes; and
   a plurality of additional transfer transistors, wherein each transfer transistor of the plurality of additional transfer transistors is coupled between a respective pinned photodiode of the plurality of additional pinned photodiodes and the pinned transfer diode.

4. The imaging pixel defined in claim 1, wherein the pinned photodiode and pinned transfer diode are formed in an upper substrate, wherein the floating diffusion region is formed in a lower substrate, and wherein the imaging pixel further comprises an interconnect layer that couples the upper substrate to the lower substrate.

5. The imaging pixel defined in claim 4, wherein the interconnect layer is formed in an opaque dielectric layer.

6. The imaging pixel defined in claim 4, further comprising:
   an additional pinned transfer diode that is formed in the lower substrate, wherein the interconnect layer couples the pinned transfer diode in the upper substrate to the additional pinned transfer diode in the lower substrate.

7. The imaging pixel defined in claim 6, wherein the interconnect layer comprises a metal layer that shields the additional pinned transfer diode and the floating diffusion region from incident light, and wherein the metal layer acts as a reflector for incident light.

8. The imaging pixel defined in claim 6, wherein the additional pinned transfer diode has a fourth potential that is higher than the second potential and lower than the third potential.

9. The imaging pixel defined in claim 8, further comprising:
   a storage diode with a fifth potential, wherein the fifth potential is higher than the fourth potential and lower than the third potential, wherein the second transfer transistor is coupled between the additional pinned transfer diode and the storage diode; and
   a third transfer transistor coupled between the storage diode and the floating diffusion region.

10. The imaging pixel defined in claim 9, wherein the first transfer transistor is configured to transfer charge from the pinned photodiode to the pinned transfer diode when asserted, wherein the second transfer transistor is configured to transfer charge from the additional pinned transfer diode to the storage diode when asserted, and wherein the third transfer transistor is configured to transfer charge from the storage diode to the floating diffusion region when asserted.

11. The imaging pixel defined in claim 9, wherein the storage diode is a first storage diode, the imaging pixel further comprising:
    a second storage diode;
    a fourth transfer transistor coupled between the additional pinned transfer diode and the second storage diode; and
    a fifth transfer transistor coupled between the second storage diode and the floating diffusion region.

12. The imaging pixel defined in claim 11, further comprising:
    a third storage diode;
    a sixth transfer transistor coupled between the additional pinned transfer diode and the third storage diode; and
    a seventh transfer transistor coupled between the third storage diode and the floating diffusion region.

13. The imaging pixel defined in claim 11, wherein the first and second storage diodes have different sizes.

14. The imaging pixel defined in claim 11, further comprising:
    at least one additional pinned photodiode that is configured to share the pinned transfer diode with the pinned photodiode.

15. A method of operating an imaging pixel, wherein the imaging pixel comprises a pinned photodiode, a first pinned transfer diode, a second pinned transfer diode, an interconnect layer that couples the first pinned transfer diode to the second pinned transfer diode, a storage diode, a floating diffusion region, a first transfer transistor coupled between the pinned photodiode and the first pinned transfer diode, a second transfer transistor coupled between the second pinned transfer diode and the storage diode, a third transfer transistor coupled between the storage diode and the floating diffusion region, a reset transistor that is coupled between the floating diffusion region and a bias voltage, and a shutter gate that is coupled between the second pinned transfer diode and the bias voltage, the method comprising:
    resetting the pinned photodiode, the first pinned transfer diode, the second pinned transfer diode, the storage diode, and the floating diffusion region by asserting the first transfer transistor, the third transfer transistor, the shutter gate, and the reset transistor; and
    with the photodiode, accumulating charge over a total exposure time that is split into multiple integration periods, wherein the multiple integration periods are non-continuous and are each shorter than the total exposure time, wherein the charge that is accumulated in each integration period of the multiple integration periods is transferred to the storage diode.

16. The method defined in claim 15, the method further comprising:
    after each integration period of the multiple integration periods, clearing charge from the pinned photodiode, the first pinned transfer diode, and the second pinned transfer diode by asserting the first transfer transistor and the shutter gate.

17. A method of operating an imaging pixel, wherein the imaging pixel comprises a pinned photodiode, a first pinned transfer diode, a second pinned transfer diode, an interconnect layer that couples the first pinned transfer diode to the second pinned transfer diode, a first storage diode, a second storage diode, and a third storage diode, a floating diffusion region, a first transfer transistor coupled between the pinned photodiode and the first pinned transfer diode, a second transfer transistor coupled between the second pinned transfer diode and the first storage diode, a third transfer transistor coupled between the first storage diode and the floating diffusion region, a fourth transfer transistor coupled between the second pinned transfer diode and the second storage diode, a fifth transfer transistor coupled between the second storage diode and the floating diffusion region, a sixth transfer transistor coupled between the second pinned transfer diode and the third storage diode, a seventh transfer transistor coupled between the third storage diode and the floating diffusion region, a reset transistor that is coupled between the floating diffusion region and a bias voltage, and a shutter gate that is coupled between the second pinned transfer diode and the bias voltage, the method comprising:

resetting the pinned photodiode, the first pinned transfer diode, the second pinned transfer diode, the first storage diode, the second storage diode, the third storage diode, and the floating diffusion region by asserting the first transfer transistor, the third transfer transistor, the fifth transfer transistor, the seventh transistor, the shutter gate, and the reset transistor;

accumulating a first amount of charge in the photodiode over a first integration time;

transferring the first amount of charge to the first storage diode by asserting the first transfer transistor and the second transfer transistor;

accumulating a second amount of charge in the photodiode over a second integration time;

transferring the second amount of charge to the second storage diode by asserting the first transfer transistor and the fourth transfer transistor;

accumulating a third amount of charge in the photodiode over a third integration time; and transferring the third amount of charge to the third storage diode by asserting the first transfer transistor and the sixth transfer transistor.

18. The method defined in claim 17, wherein the first integration time is longer than the second integration time, and wherein the second integration time is longer than the third integration time.

19. The method defined in claim 17, further comprising:

reading out the charge on the first storage diode using correlated double sampling;

reading out the charge on the second storage diode using correlated double sampling; and reading out the charge on the third storage diode using correlated double sampling.

20. The method defined in claim 19, further comprising:

after transferring the third amount of charge to the third storage diode and before reading out the charge on the first storage diode:

accumulating a fourth amount of charge in the photodiode over a fourth integration time; and transferring the fourth amount of charge to the first storage diode by asserting the first transfer transistor and the second transfer transistor.

* * * * *